United States Patent [19]
Snodgrass et al.

[11] Patent Number: 5,311,406
[45] Date of Patent: May 10, 1994

[54] MICROSTRIP PRINTED WIRING BOARD AND A METHOD FOR MAKING SAME

[75] Inventors: Kenneth L. Snodgrass, Peoria; Robert S. Doyle, Glendale; James R. Troxel, Glendale; Thomas M. Europa, Glendale; Glenn B. Oborn, Glendale, all of Ariz.

[73] Assignee: Honeywell Inc., Minneapolis, Minn.

[21] Appl. No.: 785,132

[22] Filed: Oct. 30, 1991

[51] Int. Cl.$^5$ .......................... H05K 7/14; B22F 7/02
[52] U.S. Cl. .................................. 361/792; 428/549; 427/307
[58] Field of Search .............. 361/397, 412, 414, 792; 428/549; 427/307

[56] References Cited

U.S. PATENT DOCUMENTS

| | | | |
|---|---|---|---|
| 3,872,236 | 3/1975 | Swengel, Sr. et al. | 174/68.5 |
| 3,969,816 | 7/1976 | Swengel, Sr. et al. | 29/625 |
| 4,079,268 | 3/1978 | Fletcher | 307/151 |
| 4,640,866 | 2/1987 | Suzuki et al. | 428/422 |
| 5,004,639 | 4/1991 | Desai | 428/138 |
| 5,097,390 | 3/1992 | Gerrie et al. | 361/412 |

*Primary Examiner*—Peter A. Nelson
*Attorney, Agent, or Firm*—Arthur A. Sapelli; Dale E. Jepsen; Ronald E. Champion

[57] ABSTRACT

A multi-layered printed wiring board for high frequency application includes a first board of polytetrafluoroethylene (PTFE) having a metallic sheet on each side. The first side is etched to form high frequency circuity using micro-strip technology and the second side being a metallic sheet forming the ground plane. Laminated to the ground plane of the first board is a fiberglass board of thickness, A. Further, laminated to the fiberglass board is a second board of fiberglass having a thickness, A. The second board also has metallic sheets on both side, the side being laminated to the fiberglass board being etched to form strips, prior to being laminated, forming signal and transmission lines utilizing strip-line technology. Vias are formed to interconnect predetermined metallic layers.

5 Claims, 2 Drawing Sheets

MICROSTRIP PRINTED WIRING BOARD AND A METHOD FOR MAKING SAME

BACKGROUND OF THE INVENTION

The present invention relates to printed circuit wiring boards, and more particularly, to multi-layer printed circuit wiring boards (sometimes referred to herein as multi-layer printed wiring boards, PWB) for microwave circuits employing microstrip line and/or stripline techniques, and a method for making same.

Circuity designed for high frequency application, including radars, transponders, . . . in the gigahertz range, cannot be designed utilizing lumped elements such as resistors and capacitors. Various design techniques are utilized including techniques well known in the art as microstrip and stripline. Microstrip consists of a wire above a ground plane, being analogous to a two-wire line in which one of the wires is represented by an image in the ground plane of the wire that is physically present. The metallic strip conductor is bonded to a dielectric sheet, and a metallic ground plane (or plate) is bonded to the other side of the dielectric sheet. [Strip transmission lines differ from microstrip in that a second ground plane is placed above the strip conductor (or conductor strip).] Conductor pads, having a variety of geometric patterns, are also bonded to the dielectric and exhibit resistive, capacitive, and inductive properties at the frequency range of interest thereby forming the high frequency circuit. The dielectric sheet utilized for these high frequency circuit include fiberglass of various types having a variety of parameters. Fiberglass has a dielectric constant which is about 4, and has high power loss (an order of magnitude as that of PTFE) and the size of the elements on the fiberglass sheet would be substantially bigger.

Polytetrafluoroethylene (PTFE), more commonly known as "TEFLON", a trademark of the Dupont Co., has also been used for the dielectric sheet of circuits of 1 gigahertz (GHZ) or higher. Generally, PTFE has low power loss at the high frequencies as compared to fiberglass. Further, the dielectric constant of PTFE can range in value from about 2 to 11 and is very constant across the entire printed wiring board and constant from lot-to-lot.

However, there are some drawbacks with the use of PTFE dielectric sheets for PWBs. These boards are very flexible, unless brass backed, which adds weight and cost. The flexibility of these PWBs cause solder joint failures due to handling. Signal routing, which includes bias lines, modulation, . . . , is accomplished utilizing "feed-thru" capacitors which are expensive, costly to install, and very unreliable due to the internal multi-layer ceramics make-up of such capacitors. Multi-layered PWBs for high frequency applications currently exist utilizing multi-layers of PTFE in an attempt to reduce board flexibility and signal routing; however, these boards are very costly due to the high cost of PTFE.

Thus, it is desired to provide a new and unique printed wire board which is reliable, eliminates the need for utilizing feed-thru capacitors, is substantial rigid thereby eliminating solder joint failures due to flexure, has a high dielectric constant permitting the size of the PWB to remain relatively small and to have the low power loss, and permits signal lines and transmission lines carrying bias, modulation, . . . to be routed internally as a stripline thereby eliminating the need for coaxial cables and wires including the hand soldering of the connections made by the coax cables and wires. The new and unique board of the present invention solves the above-mentioned problems by providing a "hybrid" board; namely, a board constructed of two dissimilar materials —PTFE and fiberglass. The board flexibility is greatly reduced increasing board reliability, and the cost of the board is substantially reduced. Further, both microstrip and stripline techniques are used on the "hybrid" board.

SUMMARY OF THE INVENTION

Therefore, there is provided by the present invention, a multi-layered printed wiring board for high frequency application. The multi-layered printed wiring board of the present invention comprises a first board having an inner layer, and a first and second outer layer, the inner layer being a polytetrafluoroethylene (PTFE) material having a predetermined dielectric constant. The first outer layer has high frequency circuity of a metallic material bonded to a first side of the inner layer, and the second outer layer is a sheet of a metallic material bonded to a second side of the inner layer. A second board has an inner layer, and a first and second outer layer, the inner layer being a fiberglass material of a predetermined thickness. The first outer layer of the second board has strips of a metallic material bonded to a first side of the inner layer of the second board, and the second outer layer is a sheet of a metallic material bonded to a second side of the inner layer of the second board. A third board is included which is a fiberglass material of a predetermined thickness, such that the thickness of the third board is the same thickness as that of the inner layer of the second board. The strips of second board form signal lines and transmission lines, the strips being bonded onto the first side of the inner layer of the second board in predetermined locations such that the strips are connected to predetermined high frequency circuity by vias, vias being utilized to electrically interconnect predetermined metallic layers. The second outer layer of the first board is laminated to a first side of the third board, and the first outer layer of the second board is laminated to a second side of the third board, thereby forming the multi-layered printed wiring board.

Accordingly, it is an object of the present invention to provide a multi-layered printed wiring board for high frequency applications.

It is a further object of the present invention to provide a microstrip multi-layered printed wiring board.

It is yet another object of the present invention to provide a low-cost, hybrid multi-layered printed wiring board for high frequency applications.

It is still another object of the present invention to provide a method for making a microstrip multi-layered printed wiring board.

These and other objects of the present invention will become more apparent when taken in conjunction with the following description and attached drawings, wherein like numbers indicate like parts, and which drawings form a part of the present application.

DETAILED DESCRIPTION

Figure 1:
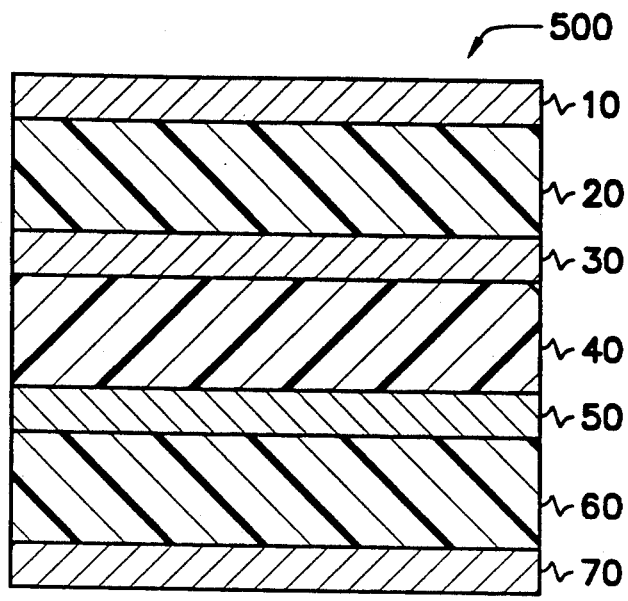
FIG. 1 shows a cross-section of the layers of a multi-layer printed wiring board (PWB) of the present invention.

Referring to FIG. 1, there is shown a cross section of multiple layers of a multi-layer printed wire board (PWB) 500 of the present invention.

A first layer 10 comprises a metallic layer, in the preferred embodiment of the present invention the metal being copper. A second layer 20 is a polytetrafluoroethylene (PTFE) material in the preferred embodiment of the present invention the PTFE material having a dielectric constant of approximately 10.8. A third layer 30 is a metallic sheet, in the preferred embodiment of the present invention a copper sheet. A fourth layer 40 and a sixth layer 60 are a fiberglass material. A fifth layer 50 and seventh layer 70 is a metallic material; namely, in the preferred embodiment of the present invention, copper.

Figure 2:
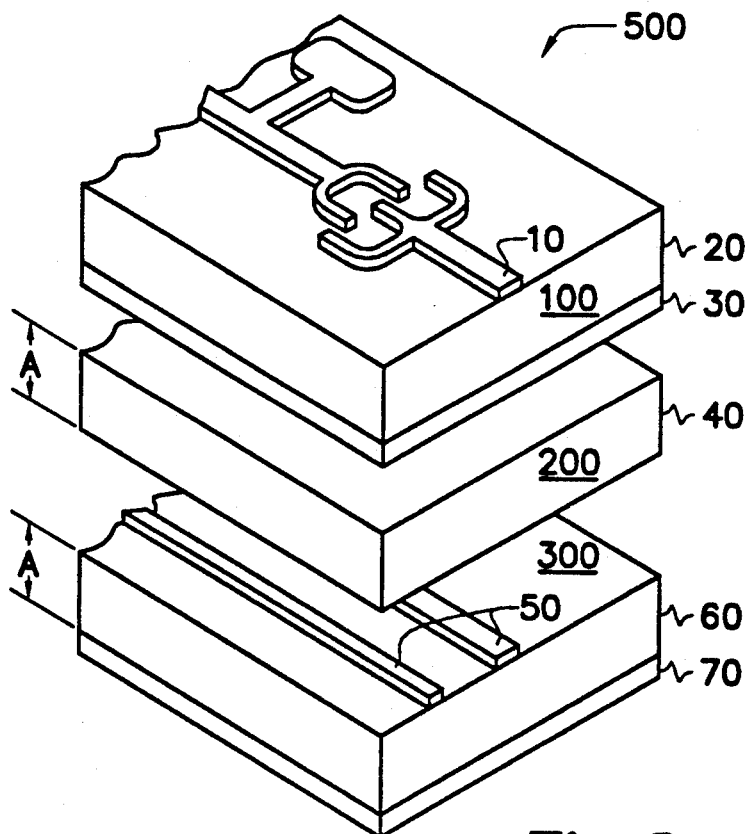
FIG. 2 shows an exploded isometric view of the printed wiring board of FIG. 1.

Referring to FIG. 2 there is shown an exploded isometric view of the PWB 500 of the present invention. A first board 100 comprises the first, second, and third layers 10, 20, 30, respectively. The first layer 10 is the copper sheet bonded to the second layer 20 which has been etched by techniques well known in the art, to generate a predetermined geometric pattern having desired circuit element properties, such as resistors, capacitors, inductor, filters . . . , resulting in a desired circuit for the frequency of interest, the frequency of the preferred embodiment being suitable for the gigahertz (GHZ) range. The first layer 10 of first board 100 is bonded to the second layer 20, which is the PTFE material, which in turn is bonded to the third layer 30, in the preferred embodiment of the present invention a copper sheet. The third layer 30 or copper sheet 30, is a ground plane for the etched circuit elements of sheet 10, and with the second layer 20 or dielectric sheet 20, interposed between the etched patterns of layer 10 and ground plane 30, a high frequency circuit utilizing microstrip techniques results therefrom.

A third board 300 comprises the fifth and seventh layers 50, 70 bonded to the sixth layer 60, the fifth and seventh layer 50, 70, being copper and the sixth layer 60 being a fiberglass material having a thickness A. The fifth layer 50 is etched to form predetermine strips, or lines, which carry the various signals to/from the high frequency circuity (i.e., the microstrip circuits) of the first layer 10. The lines include signal lines which conduct various type signals, such as, bias signals, modulation signals, power, . . . the signal lines having no specific characteristics. Also included in the lines are transmission lines for conducting rf signals, the transmission lines having specific characteristics, such as 50 ohm impedance at a predetermined frequency. (This is stripline.)

The third board 300 is laminated to a second board 200, by techniques well known in the art, and second board 200 is laminated to first board 100, forming the single multi-layer PWB 500. In the preferred embodiment of the present invention, the second board 200 or fourth layer 40, is the same type of fiberglass material as the sixth layer 60, and has the same (or substantially the same, i.e., with a predetermined tolerance) thickness, A. Thus it can be seen that the etched strips of fifth layer 50 form the lines, signal lines and transmission lines (for the high frequency circuity of first layer 10) between the ground planes of third layer 30 and seventh layer 70. The strip transmission lines eliminate hand soldering wires and coax cables to couple signals across the printed wiring board. No rf cables or rf connectors are utilized on the board of the present invention, except for two connectors to couple outside signals onto and off the multilayer PWB 500 of the present invention. The rf connectors connect to predetermined ones of the transmission lines (or strips of the fifth layer 50).

Holes are drilled in predetermined locations of the PWB 500 to the transmission lines (or strips) 50. The inner walls of the drilled hole (or holes) are plated (by any technique known in the art, in the preferred embodiment of the present invention, by electrolysis) with copper, thereby forming vias (not shown). As a result the high frequency of layer 10 is connected at predetermined points to the transmission lines of layer 50, and any other connections required to be made to the inner layers is performed by generating vias by techniques well known in the art.

Figure 3:
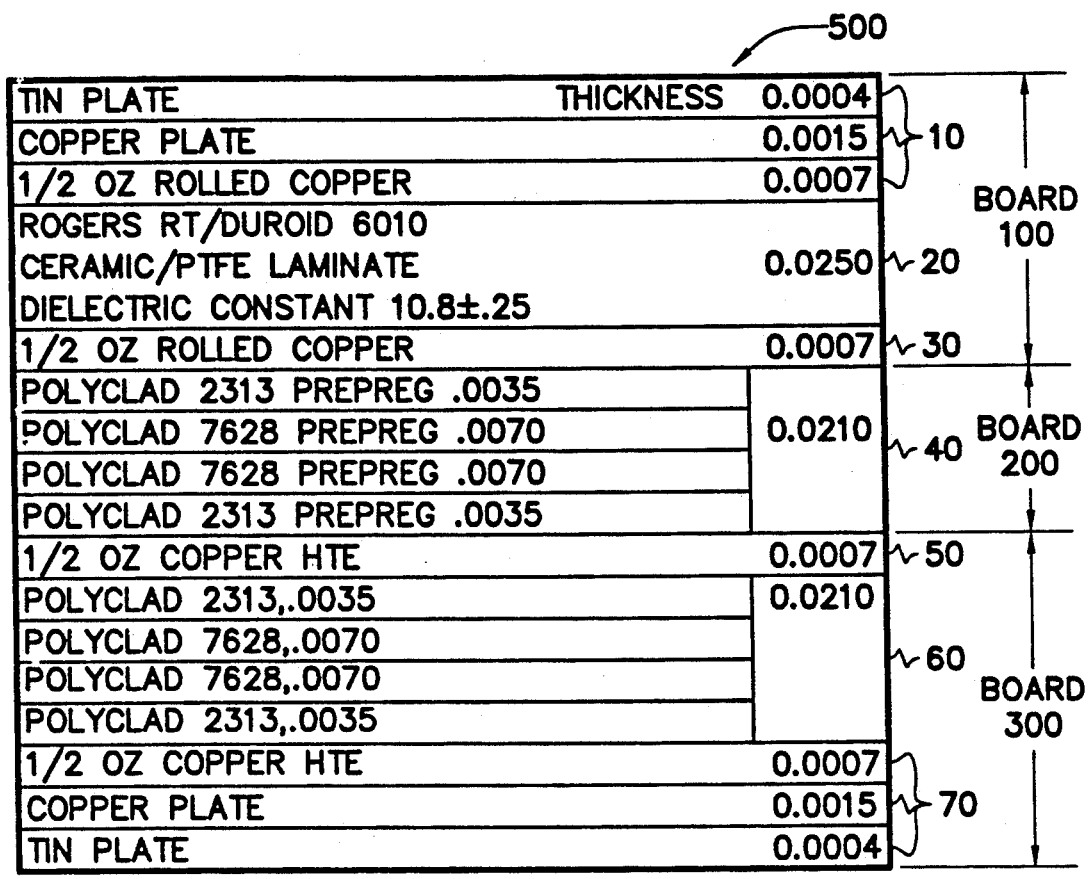
FIG. 3 shows the specific materials of the individual layers of the PWB of the preferred embodiment of the present invention.

FIG. 3 shows the specific material of the layers, 10-70, of the printed wire board 500. The copper plate is a result of the "via process". The tin plate is specifically added on in order to increase solderability to the copper and to prevent any contamination or oxidation of the copper.

Although the preferred embodiment of the present invention includes fourth layer 40 and sixth layer 60 of the same type of fiberglass material having the same thickness, A, it will be recognized by those skilled in the art that the thickness of these layers is not required to be the same, especially if offset stripline techniques are to be used. It will also be recognized by those skilled in the art that other dielectric materials can be used in place of fiberglass, such as epoxies, synthetic resins, plastics, . . . .

Figure 4:
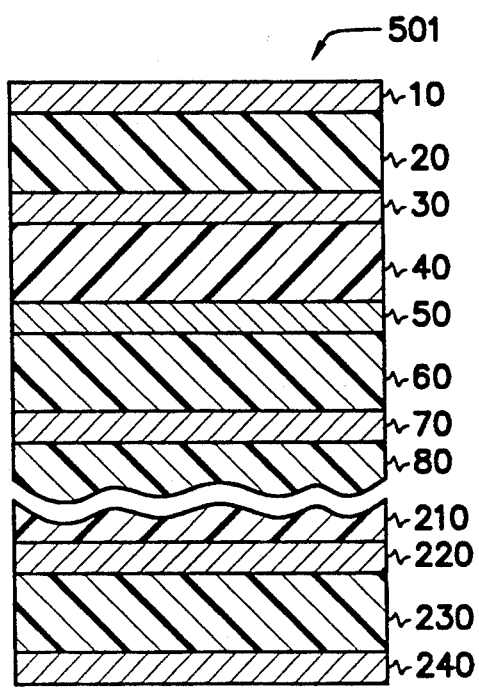
FIG. 4 shows a cross-section for the layers of an alternative embodiment of a multi-layered PWB within the scope of the present invention.

Referring to FIG. 4, there is shown a cross-section of the layers of an alternative embodiment of a multi-layered PWB of the present invention. The PWB of the alternative embodiment 501 includes a first layer 10 which is a metallic layer configured to form the microstrip high frequency circuity. In such an alternative embodiment, the microstrip high frequency circuit is an external layer of the PWB 501, such as first layer 10. The first layer 10 is bonded to a second layer 20, a PTFE material. A third layer 30 is a metallic sheet bonded to the other side (or surface) of the PTFE layer 20, thereby forming the ground plane for the microstrip high frequency circuity of first layer 10. The remaining layers, 40 through 240, are alternating metallic sheets and dielectric sheets of predetermined thicknesses of predetermined dielectric materials, some of which can include PTFE and materials dissimilar from PTFE. External metallic layer 240 can be a microstrip circuit, and predetermined ones of the internal metallic layers can be stripline, as discussed above. Vias (not shown) interconnect predetermined metallic layers in a manner well known in the art.

While there has been shown what is considered the preferred embodiment of the present invention, it will be manifest that many changes and modifications can be made therein without departing from the essential spirit and scope of the invention. It is intended, therefore, in the annexed claims, to cover all such changes and modifications which fall within the true scope of the invention.

We claim:

1. A multi-layered printed wiring board comprising:
a) a first board having an inner layer, and a first and second outer layer, the inner layer being a polytetrafluoroethylene (PTFE) material having a predetermined dielectric constant, the first outer layer having high frequency circuity of a metallic material bonded to a first side of said inner layer, and the second outer layer being a sheet of a metallic material bonded to a second side of said inner layer;
b) a second board having an inner layer, and a first and second outer layer, the inner layer being a fiberglass material of a predetermined thickness, the first outer layer of said second board having strips of a metallic material bonded to a first side of said inner layer of the second board, and the second outer layer of said second board being a sheet of a metallic material bonded to a second side of said inner layer of the second board; and
c) a third board, being a fiberglass material of a predetermined thickness, such that the thickness of the third board is the same thickness as that of the inner layer of said second board, wherein the strips of said second board form signal lines and transmission lines, the strips being bonded onto the first side of the inner layer of the second board in predetermined locations such that the strips are connected to predetermined high frequency circuity by vias, vias electrically interconnecting predetermined metallic layers, the second outer layer of the first board being laminating to a first side of the third board, and the first outer layer of said second board being laminated to a second side of said third board, thereby forming the multi-layered printed wiring board.

2. A multi-layered printed wiring board comprising:
a) a first board having an inner layer, and a first and second outer layer, the inner layer being a polytetrafluoroethylene (PTFE) material having a predetermined dielectric constant, the first outer layer having high frequency circuity of a metallic material bonded to a first side of said inner layer, and the second outer layer being a sheet of a metallic material bonded to a second side of said inner layer;
b) a second board having an inner layer, and a first and second outer layer, the inner layer being a fiberglass material of a first predetermined thickness, the first outer layer of said second board having strips of a metallic material bonded to a first side of said inner layer of the second board, and the second outer layer of said second board being a sheet of a metallic material bonded to a second side of said inner layer of the second board; and
c) a third board, being a fiberglass material of a second predetermined thickness, wherein the strips of said second board form signal lines and transmission lines, the strips being bonded onto the first side of the inner layer of the second board in predetermined locations such that the strips are connected to predetermined high frequency circuity by vias, vias electrically interconnecting predetermined metallic layers, the second outer layer of the first board being laminating to a first side of the third board, and the first outer layer of said second board being laminated to a second side of said third board, thereby forming the multi-layered printed wiring board.

3. A multi-layered printed wiring board comprising:
a) a first board having an inner layer, and a first and second outer layer, the inner layer being a polytetrafluoroethylene (PTFE) material having a predetermined dielectric constant, the first outer layer having high frequency circuity of a metallic material bonded to a first side of said inner layer, and the second outer layer being a sheet of a metallic material bonded to a second side of said inner layer;
b) a second board having an inner layer, and a first and second outer layer, the inner layer being a first dielectric material of a first predetermined thickness, the first outer layer of said second board having strips of a metallic material bonded to a first side of said inner layer of the second board, and the second outer layer of said second board being a sheet of a metallic material bonded to a second side of said inner layer of the second board; and
c) a third board, being a second dielectric material of a second predetermined thickness, wherein said first dielectric material and said second dielectric material are dissimilar from the PTFE material, wherein the strips of said second board form signal lines and transmission lines, the strips being bonded onto the first side of the inner layer of the second board in predetermined locations such that the strips are connected to predetermined high frequency circuity by vias, vias electrically interconnecting predetermined metallic layers, the second outer layer of the first board being laminating to a first side of the third board, and the first outer layer of said second board being laminated to a second side of said third board, thereby forming the multi-layered printed wiring board.

4. A multi-layered printed wiring board comprising:
a) a first layer of a metallic material having a geometric configuration to form a microstrip high frequency circuit;
b) a second layer of a polytetrafluoroethylene (PTFE) material, the first layer being bonded to a first surface of the second layer;
c) a third layer of a metallic material, wherein the third layer is bonded to a second surface of the second layer thereby forming a ground plane for the microstrip high frequency circuity of the first layer;
d) a plurality of dielectric layers, each dielectric layer having a predetermined thickness and being of a predetermined dielectric material dissimilar from the PTFE material, and such that a first dielectric layer of the plurality of dielectric layers is bonded to the third layer;
e) a plurality of metallic layers, wherein predetermined layers of the plurality of metallic layers are configured to form signal lines and transmission lines utilizing stripline techniques, and wherein a first metallic layer of the plurality of metallic layers is bonded to the first dielectric layer of the plurality of dielectric layers, and further wherein dielectric layers of the plurality of dielectric layer are alternately bonded with metallic layers of the plurality of metallic layers thereto, predetermined metallic layers of the plurality of metallic layers and the first and the third layer having predetermined electrical interconnections by vias, thereby forming the multi-layered printed wiring board.

5. A method for making a multi-layered wiring board comprising the steps of:

a) etching a first side of a first board, such that high frequency circuity results on the first side of the first board, the first board being a polytetraflureothylene (PTFE) material having a metallic sheet bonded to each side of the first board;

b) etching a first side of a second board, such that strips result in predetermined locations on the first side of the said second board, the second board being a fiberglass material of a predetermined thickness, having a metallic sheet bonded to each side of the second board;

c) laminating a third board of a fiberglass material, having the same predetermined thickness as the fiberglass material of said second board, to the first board and the third board such that the strips form an internal layer of the multi-layered printed wiring board and the high frequency circuity is an external layer of the multi-layered printed wiring board;

d) drilling holes in the printed wiring board to form vias for interconnecting predetermined metallic layers; and e) plating inner walls of the holes drilled with an electrically conducting material thereby interconnecting the predetermined metallic layers.

* * * * *